United States Patent
Mader et al.

(10) Patent No.: US 9,887,313 B2
(45) Date of Patent: Feb. 6, 2018

(54) METHOD FOR PRODUCING DIFFERENTLY DOPED SEMICONDUCTORS

(71) Applicants: Christoph Mader, Muenster (DE); Christian Guenther, Wuppertal (DE); Joachim Erz, Schwoerstadt (DE); Susanne Christine Martens, Essen (DE); Jasmin Lehmkuhl, Haltern am See (DE); Stephan Traut, Loerrach Brombach (DE); Odo Wunnicke, Muenster (DE)

(72) Inventors: Christoph Mader, Muenster (DE); Christian Guenther, Wuppertal (DE); Joachim Erz, Schwoerstadt (DE); Susanne Christine Martens, Essen (DE); Jasmin Lehmkuhl, Haltern am See (DE); Stephan Traut, Loerrach Brombach (DE); Odo Wunnicke, Muenster (DE)

(73) Assignee: Evonik Degussa GmbH, Essen (DE)

( * ) Notice: Subject to any disclaimer, the term of this patent is extended or adjusted under 35 U.S.C. 154(b) by 0 days.

(21) Appl. No.: 15/307,689

(22) PCT Filed: Apr. 17, 2015

(86) PCT No.: PCT/EP2015/058371
§ 371 (c)(1),
(2) Date: Oct. 28, 2016

(87) PCT Pub. No.: WO2015/165755
PCT Pub. Date: Nov. 5, 2015

(65) Prior Publication Data
US 2017/0054050 A1 Feb. 23, 2017

(30) Foreign Application Priority Data

Apr. 29, 2014 (DE) .................... 10 2014 208 054

(51) Int. Cl.
| | | |
|---|---|---|
| *H01L 21/00* | (2006.01) | |
| *H01L 31/18* | (2006.01) | |
| *H01L 21/22* | (2006.01) | |
| *H01L 21/228* | (2006.01) | |

(52) U.S. Cl.
CPC ........ *H01L 31/1804* (2013.01); *H01L 21/228* (2013.01); *H01L 21/2225* (2013.01); *H01L 31/1864* (2013.01); *Y02E 10/547* (2013.01); *Y02P 70/521* (2015.11)

(58) Field of Classification Search
None
See application file for complete search history.

(56) References Cited

U.S. PATENT DOCUMENTS

| | | |
|---|---|---|
| 9,040,401 B1 | 5/2015 | Sun et al. |
| 2008/0111206 A1 | 5/2008 | Hanoka et al. |
| 2009/0071539 A1 | 3/2009 | Choi et al. |
| 2010/0075485 A1 | 3/2010 | Rana et al. |
| 2010/0323503 A1 | 12/2010 | Rana et al. |
| 2011/0240997 A1 | 10/2011 | Rockenberger et al. |
| 2012/0052618 A1 | 3/2012 | Inns |
| 2012/0132109 A1 | 5/2012 | Morita et al. |

(Continued)

FOREIGN PATENT DOCUMENTS

| | | |
|---|---|---|
| DE | 10 2010 040 231 A | 3/2012 |
| DE | 10 2011 075 232 B4 | 2/2015 |

(Continued)

OTHER PUBLICATIONS

International Search Report dated Jun. 18, 2015 in PCT/EP2015/058371.

(Continued)

*Primary Examiner* — Calvin Choi
(74) *Attorney, Agent, or Firm* — Oblon, McClelland, Maier & Neustadt, L.L.P.

(57) ABSTRACT

The present invention relates to a liquid-phase method for doping a semiconductor substrate, characterized in that a first composition containing at least one first dopant is applied to one or more regions of the surface of the semiconductor substrate, in order to create one or more region(s) of the surface of the semiconductor substrate coated with the first composition; a second composition containing at least one second dopant is applied to one or more regions of the surface of the semiconductor substrate, in order to create one or more region(s) of the surface of the semiconductor substrate coated with the second composition, where the one or more region(s) coated with the first composition and the one or more region(s) coated with the second composition are different and do not overlap significantly and where the first dopant is an n-type dopant and the second dopant is a p-type dopant or vice versa; the regions of the surface of the semiconductor substrate coated with the first composition and with the second composition are each fully or partly activated; optionally, the unactivated regions of the surface of the semiconductor substrate coated with the first composition and with the second composition are each oxidized; and the semiconductor substrate is heated to a temperature at which the dopants diffuse out of the coating into the semiconductor substrate. The invention further relates to the semiconductor obtainable by the method and to the use thereof, especially in the production of solar cells.

26 Claims, 1 Drawing Sheet

(56) References Cited

U.S. PATENT DOCUMENTS

| | | |
|---|---|---|
| 2012/0291665 A1 | 11/2012 | Wieber et al. |
| 2013/0168824 A1 | 7/2013 | Wieber et al. |
| 2013/0183223 A1 | 7/2013 | Wieber et al. |
| 2013/0228902 A1 | 9/2013 | Tomizawa et al. |
| 2014/0087549 A1 | 3/2014 | Sun et al. |
| 2014/0162444 A1 | 6/2014 | Inns |
| 2015/0243806 A1* | 8/2015 | Hu .................... H01L 31/02363 438/71 |

FOREIGN PATENT DOCUMENTS

| | | |
|---|---|---|
| EP | 2 040 310 A2 | 3/2009 |
| EP | 2 040 310 A3 | 3/2009 |
| EP | 2 713 384 A1 | 4/2014 |
| WO | WO 2011/104147 A1 | 9/2011 |
| WO | WO 2012/041837 A2 | 4/2012 |
| WO | WO 2012/041837 A3 | 4/2012 |
| WO | WO 2014/014112 A1 | 1/2014 |
| WO | WO 2014/014112 A9 | 1/2014 |

OTHER PUBLICATIONS

German Office Action dated Mar. 2, 2015 in Patent Application No. 10 2014 208 054.1.

\* cited by examiner

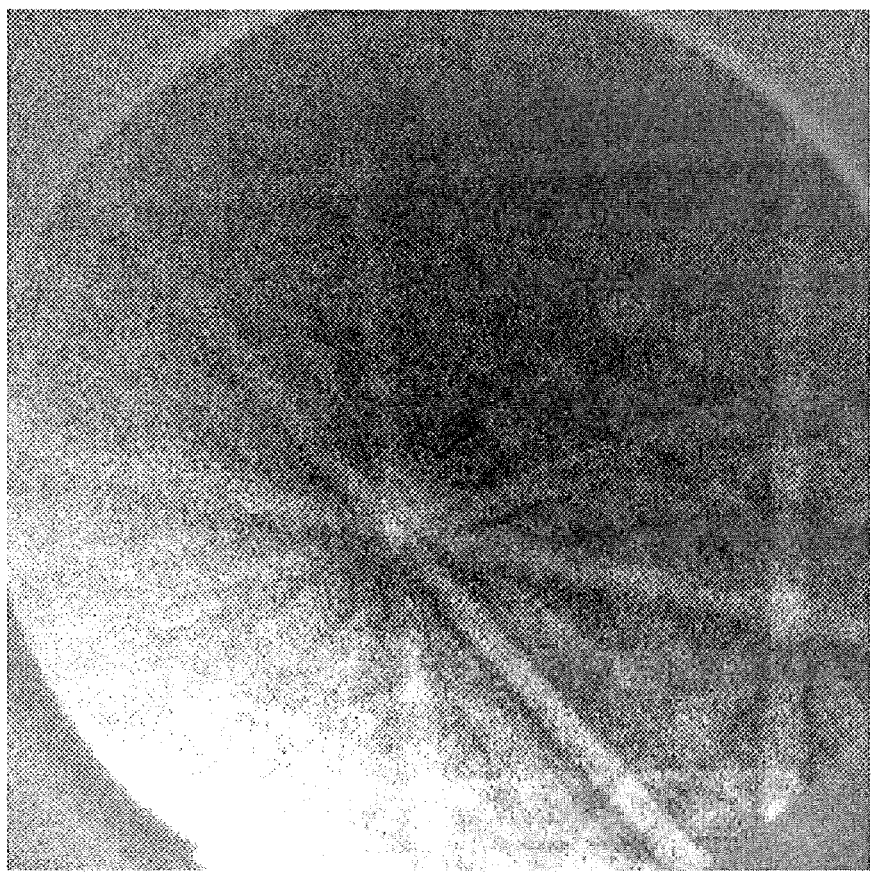

METHOD FOR PRODUCING DIFFERENTLY DOPED SEMICONDUCTORS

The present invention relates to a method for producing differently doped semiconductors, to the semiconductors obtainable by the method and to the use thereof.

Various applications require doped semiconductor layers, for example in photovoltaics. Photovoltaics is based on the generation of free charge carriers in a semiconductor by means of incident light. For electrical utilization of these charge carriers (separation of electrons and holes), a p-n junction in the semiconductor is required. Typically, silicon is used as the semiconductor. The silicon wafer used typically has base doping, for example with boron (p-type). Typically, the p-n junction is produced by inward diffusion of phosphorus (n-type dopant) from the gas phase at temperatures around 900° C. Both semiconductor types (p and n) are connected to metal contacts for extraction of the corresponding charge carriers.

For optimization of the p-n junction, it is advantageous to produce high doping beneath the metal contacts to be applied (to reduce contact resistance), whereas low doping is advantageous in the region between the contacts in order to reduce recombination and free carrier absorption. To produce the highest efficiencies in relation to energy conversion, it is further advantageous, as well as a p-n junction, likewise to produce junctions between regions of the same doping type with different degrees of doping ($p$-$p^+$ or $n$-$n^+$).

The prior art already discloses methods for doping semiconductor substrates. For example, US 2012/0052618 A1 discloses a method for selective doping of a wafer through the use of a liquid silicon precursor compound containing dopants, which is applied to the wafer and converted partly to layers containing elemental silicon, and the unconverted regions of the coating are then oxidized. By virtue of the different diffusion rates of the converted and oxidized regions, it is subsequently possible to produce regions with high and low doping in the wafer. However, there is no mention of doping with different dopants (p- and n-type).

The problem addressed by the present invention is therefore that of providing a method for doping a semiconductor, which enables production of differently doped regions on the semiconductor in relation to the type and concentration of the dopant atoms.

The present problem is solved by the liquid-phase method according to the invention for doping a semiconductor substrate, especially a silicon wafer, in which a first composition containing at least one first dopant is applied to one or more regions of the surface of the semiconductor substrate, in order to create one or more region(s) of the surface of the semiconductor substrate coated with the first composition;

a second composition containing at least one second dopant is applied to one or more regions of the surface of the semiconductor substrate, in order to create one or more region(s) of the surface of the semiconductor substrate coated with the second composition, where the one or more region(s) coated with the first composition and the one or more region(s) coated with the second composition are different and do not overlap significantly, if at all, and where the first dopant is an n-type dopant and the second dopant is a p-type dopant or vice versa;

the regions of the surface of the semiconductor substrate coated with the first composition and with the second composition are each partly or fully activated;

optionally, the unactivated regions of the surface of the semiconductor substrate coated with the first composition and with the second composition are each oxidized; and the semiconductor substrate is heated to a temperature at which the dopants diffuse out of the coating into the semiconductor substrate.

BRIEF DESCRIPTION OF DRAWINGS

The figure shows a diffraction image of the silicon wafer during the outward diffusion in Example 1.

The compositions used in this method are preferably precursor compositions. A precursor is understood here to mean a chemical compound which is essentially soluble in the solvent used in the composition or a liquid chemical compound of one or more semiconductor atoms which can be converted to the semiconductor material thermally or with electromagnetic radiation. Even though the invention is described hereinafter with reference to precursor compositions of this kind, it is not restricted to this embodiment.

A liquid-phase method is understood in the present context to mean a method in which at least one liquid composition (containing at least one liquid precursor of the semiconductor or dopant material with further other liquid or solid dopant precursors, semiconductor precursors and optionally other additives dissolved or dispersed therein) and/or at least one solvent-containing formulation containing the dopants (which are themselves liquid or solid), optionally semiconductor precursors (and optionally further additives), are applied to the substrate to be doped. In the case of silicon-based semiconductor precursors, these may then subsequently be converted, for example thermally or with electromagnetic radiation, to an essentially elemental, amorphous, monocrystalline and/or polycrystalline silicon-containing coating. Dopant precursors present are converted at the same time essentially to the underlying dopants and incorporated into the silicon-containing coating that forms. The doped semiconductor substrate that forms as the product is thus a semiconductor substrate which has been coated with at least one doped semiconductor layer. The substrate itself can still (but need not) be doped by inward diffusion of dopant.

An "activation" for the purposes of the present invention is understood to mean a "conversion" of the coating from a precursor composition to the elemental, amorphous, monocrystalline and/or polycrystalline silicon-containing coating mentioned. "Partial activation" means here that not the entire coating but only selected component regions are converted. Based on the respective coated area, this may mean, for example that not less than 2% and not more than 98% of the area, preferably not less than 5% and not more than 50% of the area, is converted in this way. In various embodiments of the invention, however, the entire coating, i.e. 100% of the area, is activated.

The p-type and n-type dopants may especially take the form of element compounds of main group III and V respectively. The at least one n-type dopant may preferably be selected from phosphorus-containing dopants, especially $PH_3$, $P_4$, $P(SiMe_3)_3$, $PhP(SiMe_3)_2$, $Cl_2P(SiMe_3)$, $PPh_3$, $PMePh_2$ and $P(t\text{-}Bu)_3$, arsenic-containing dopants, especially $As(SiMe_3)_3$, $PhAs(SiMe_3)_2$, $Cl_2As(SiMe_3)$, $AsPh_3$, $AsMePh_2$, $As(t\text{-}Bu)_3$ and $AsH_3$, antimony-containing dopants, especially $Sb(SiMe_3)_3$, $PhSb(SiMe_3)$, $Cl_2Sb(SiMe_3)$, $SbPh_3$, $SbMePh_2$ and $Sb(t\text{-}Bu)_3$, and mixtures of the above. The at least one p-type dopant may preferably be selected from boron-containing dopants, especially $B_2H_6$, $BH_3$*THF, BEt$_3$, BMe$_3$, B(SiMe$_3$)$_3$, PhB(SiMe$_3$)$_2$, Cl$_2$B(SiMe$_3$), BPh$_3$, BMePh$_2$, and B(t-Bu)$_3$, and mixtures thereof.

"At least one" as used herein means 1 or more, i.e. 1, 2, 3, 4, 5, 6, 7, 8, 9 or more. Based on one constituent, the figure relates to the type of constituent and not to the absolute number of molecules. "At least one dopant" thus means, for example, at least one type of dopant, meaning that it is possible to use one type of dopant or a mixture of two or more different dopants. Together with stated amounts, the number relates to all the compounds of the specified type that are present in the composition/mixture, meaning that the composition does not contain any further compounds of this kind over and above the specified amount of corresponding compounds.

All percentages stated in connection with the compositions described herein relate, unless explicitly stated otherwise, to % by weight, based in each case on the corresponding composition.

"Roughly" or "about" as used herein in connection with a numerical value relates to the numerical value±10%, preferably ±5%.

The activated coatings producible by the method according to the invention may contain or consist of elemental silicon, for example in amorphous, monocrystalline and/or polycrystalline form, in combination with the particular dopant. The activated coatings produced by the method according to the invention may likewise be coatings which, as well as elemental silicon and the particular dopant, also contain other elements. Similarly, the oxidized coatings producible by the method according to the invention may contain or consist of silicon oxide in combination with the particular dopant. In these coatings too, it is optionally possible for other elements to be present.

In the methods according to the invention, the coatings with the first composition and with the second composition may be structured, a "structured" coating herein being understood to mean a coating which does not cover the substrate completely or essentially completely but covers the substrate partially to produce a structured pattern. Corresponding structured patterns can take on the task of solving technical problems, especially in semiconductor technology. Typical examples of structured layers are conductor tracks (for example for contact connections), finger structures or point structures (for example for emitter and base regions in back-contact solar cells) and selective emitter structures in solar cells.

In the methods of the invention, the first composition containing at least one first dopant and the second composition containing at least one second dopant are applied to different regions of the substrate surface that do not overlap or essentially do not overlap. "Essentially not overlapping" means here that the regions overlap over not more than 5% of their respective areas. It is preferable that the regions do not overlap at all, but such overlaps may occur as a result of the process. In that case, however, these are frequently unwanted. The application can in each case be effected in a structured manner, in such a way that the first composition and the second composition are applied to the surface of the silicon wafer, for example, on one side in an interdigitated structure, or the first composition and the second composition are each applied to opposite sides of the silicon wafer.

In various embodiments, prior to the step of heating the silicon wafer (outward diffusion step) (but either before or after, but especially after, the step of activation and optionally also after the oxidation step), a third composition not containing any dopant can be applied to the activated and/or unactivated regions coated with the first and/or second composition. This means that the coating composed of the first or second composition is coated with a coating consisting of the third composition. This composition may, apart from the lack of the dopant, be identical to the first and/or second composition in terms of the constituents.

This coating with the third composition, in the outward diffusion step, prevents contamination of the diffusion oven typically used in this step, i.e. escape of the dopant atoms into the oven atmosphere.

The compositions for the purposes of the present invention, i.e. the first and second compositions and the optional third composition, are especially understood to mean compositions which are liquid under SATP conditions (25° C., 1.013 bar), which either contain at least one silicon-containing precursor which is liquid under SATP conditions or contain or consist of at least one solvent and at least one silicon-containing precursor which is liquid or solid under SATP conditions, in each case in combination with the particular dopant. Particularly good results can be achieved with compositions comprising at least one solvent and at least one silicon-containing precursor which is liquid or solid under SATP conditions, in combination with the particular dopant, since these have particularly good printability.

The precursors generally include all suitable polysilanes, polysilazanes and polysiloxanes. Preferred silicon precursors are silicon-containing compounds (which are especially liquid or solid under SATP conditions) of the formula Si$_n$X$_c$ with X=H, F, Cl, Br, I, C$_1$-C$_{10}$-alkyl, C$_1$-C$_{10}$-alkenyl, C$_5$-C$_{20}$-aryl, n≥4 and 2n≤c≤2n+2. Likewise preferred silicon-containing precursors are polysiloxanes, especially those of the formula Si$_n$H$_c$O$_d$R$_e$ with R=C$_1$-C$_{10}$-alkyl, C$_1$-C$_{10}$-alkenyl, C$_5$-C$_{20}$-aryl, n≥2 and (n−1)≤d≤n, 0≤c≤3n and 0≤e≤3n. Likewise preferred silicon-containing precursors are polysilazanes of the formula Si$_n$H$_m$N$_b$R$_c$ with R=organic radical (preferably R=C$_1$-C$_{10}$-alkyl, C$_1$-C$_{10}$-alkenyl, C$_5$-C$_{20}$-aryl, =C$_1$-C$_{10}$-alkoxy), n≥2, 0≤m≤3n, (n−1)≤b≤n and 0≤c≤3n. Likewise preferred silicon-containing precursors are silicon-containing nanoparticles. The precursors can be used either individually or in a mixture. Particular preference is given to using polysilanes. These too can be used individually or in a mixture.

Particularly good results can be obtained when a composition including at least two precursors is used, at least one of which is a hydridosilane, especially of the generic formula Si$_n$H$_{2n+2}$ with n=3 to 10, and at least one is a hydridosilane oligomer. Corresponding formulations are especially suitable for production of high-quality, thin and fine layers from the liquid phase, give good wetting of substrates that are standard in the coating operation and have sharp edges after structuring. The formulation is preferably liquid, since it can thus be handled in a particularly efficient manner.

Hydridosilanes of the formula Si$_n$H$_{2n+2}$ with n=3 to 10 are noncyclic hydridosilanes. The isomers of these compounds may be linear or branched. Preferred noncyclic hydridosilanes are trisilane, isotetrasilane, n-pentasilane, 2-silyltetrasilane and neopentasilane, and also octasilane (i.e. n-octasilane, 2-silylheptasilane, 3-silylheptasilane, 4-silylheptasilane, 2,2-disilylhexasilane, 2,3-disilylhexasilane, 2,4-disilylhexasilane, 2,5-disilylhexasilane, 3,4-disilylhexasilane, 2,2,3-trisilylpentasilane, 2,3,4-trisilylpentasilane, 2,3,3-tisilylpentasilane, 2,2,4-trisilylpentasilane, 2,2,3,3-tetrasilyltetrasilane, 3-disilylhexasilane, 2-silyl-3-disilylpentasilane and 3-silyl-3-disilylpentasilane) and nonasilane (i.e. n-nonasilane, 2-silyloctasilane, 3-silyloctasilane, 4-silyloctasilane, 2,2-disilylheptasilane, 2,3-disilylheptasilane, 2,4-disilylheptasilane, 2,5-disilylheptasilane, 2,6-disilylheptasilane, 3,3-disilylheptasilane, 3,4-disilylheptasilane, 3,5-disilylheptasilane, 4,4-disilylheptasilane, 3-disilylheptasilane, 4-disilylheptasilane, 2,2,3-trisilylhexasilane, 2,2,4-trisilylhexasilane, 2,2,5-trisilylhexasilane, 2,3,3-trisilylhexasilane, 2,3,4-trisilylhexasilane, 2,3,5-trisilylhexasilane, 3,3,4-trisilylhexasilane, 3,3,5-trisilylhexasilane, 3-disilyl-2-silylhexasilane, 4-disilyl-2-silylhexasilane, 3-disilyl-3-silylhexasilane, 4-disilyl-3-silylhexasilane, 2,2,3,3-tetrasilylpentasilane, 2,2,3,4-tetrasilylpentasilane, 2,2,4,4-tetrasilylpentasilane, 2,3,3,4-tetrasilylpentasilane, 3-disilyl-2,2-disilylpentasilane, 3-disilyl-2,3-disilylpentasilane, 3-disilyl-2,4-disilylpentasilane and 3,3-disilylpentasilane), formulations of which lead to particularly good results.

Likewise preferably, the hydridosilane of said generic formula is a branched hydridosilane which leads to more stable solutions and better layers than a linear hydridosilane.

Most preferably, the hydridosilane is isotetrasilane, 2-silyltetrasilane, neopentasilane or a mixture of nonasilane isomers, which can be prepared via thermal treatment of neopentasilane or by a method described by Holthausen et al. (poster presentation: A. Nadj, 6th European Silicon Days, 2012). The best results can be achieved with corresponding formulations.

The hydridosilane oligomer is the oligomer of a hydridosilane compound, and preferably the oligomer of a hydridosilane. The inventive formulation is of particularly good suitability for the production of thin layers when the hydridosilane oligomer has a weight-average molecular weight of 200 to 10 000 g/ml. Methods for preparation thereof are known to those skilled in the art. Corresponding molecular weights can be determined via gel permeation chromatography using a linear polystyrene column with cyclooctane as eluent against polybutadiene as reference.

The hydridosilane oligomer is preferably obtained by oligomerization of noncyclic hydridosilanes. Unlike hydridosilane oligomers formed from cyclic hydridosilanes, these oligomers have a high crosslinking level because of the different way in which the dissociative polymerization mechanism proceeds. Instead, because of the ring-opening reaction mechanism to which cyclic hydridosilanes are subject, oligomers formed from cyclic hydridosilanes have only a very low crosslinking level, if any. Corresponding oligomers prepared from noncyclic hydridosilanes, unlike oligomers formed from cyclic hydridosilanes, give good wetting of the substrate surface in solution, can be used particularly efficiently for production of thin layers and lead to homogeneous and smooth surfaces. Even better results are exhibited by oligomers formed from noncyclic, branched hydridosilanes.

A particularly preferred hydridosilane oligomer is an oligomer obtainable by thermal conversion of a composition comprising at least one noncyclic hydridosilane having not more than 20 silicon atoms in the absence of a catalyst at temperatures of <235° C. Corresponding hydridosilane oligomers and the preparation thereof are described in WO 2011/104147 A1, to which reference is made with regard to the compounds and the preparation thereof, and which is incorporated herein in its entirety by virtue of this reference. This oligomer has even better properties than the further hydridosilane oligomers formed from noncyclic, branched hydridosilanes. The hydridosilane oligomer may also have other residues aside from hydrogen and silicon. Thus, advantages of the layers produced with the formulations may result when the oligomer contains carbon. Corresponding carbon-containing hydridosilane oligomers can be prepared by co-oligomerization of hydridosilanes with hydrocarbons. Preferably, however, the hydridosilane oligomer is a compound containing exclusively hydrogen and silicon, and which thus does not have any halogen or alkyl residues.

Preference is further given to hydridosilane oligomers which have already been doped. Preferably, the hydridosilane oligomers have been boron- or phosphorus-doped. Corresponding hydridosilane oligomers can be produced by adding the appropriate dopants at the early stage of the production thereof. Alternatively, it is also possible to p-dope undoped hydridosilane oligomers already prepared with the abovementioned p-type or n-type dopants, or to n-dope them by means of a high-energy process (for example UV radiation or thermal treatment).

The proportion of the hydridosilane(s) is preferably 0.1% to 99% by weight, further preferably 1% to 50% by weight, most preferably 1% to 30% by weight, based on the total mass of the respective composition.

The proportion of the hydridosilane oligomer(s) is preferably 0.1% to 99% by weight, further preferably 1% to 50% by weight, most preferably 1% to 20% by weight, based on the total mass of the respective composition.

The proportion of the hydridosilane oligomer in the respective formulation, in order to achieve particularly good results, is additionally preferably 40%-99.9% by weight, more preferably 60%-99% and most preferably 70%-90% by weight, based on the total mass of hydridosilane and hydridosilane oligomer present.

The compositions used in the method according to the invention need not contain any solvents. However, they preferably include at least one solvent. If they contain a solvent, the proportion thereof is preferably 0.1% to 99% by weight, more preferably 25% to 95% by weight, most preferably 60% to 95% by weight, based on the total mass of the respective formulation.

Very particular preference is given to compositions having 1%-30% by weight of hydridosilane, 1%-20% by weight of hydridosilane oligomer and 60%-95% by weight of solvent, based on the total mass of the formulation.

Solvents usable with preference for the compositions described herein are those selected from the group consisting of linear, branched and cyclic, saturated, unsaturated and aromatic hydrocarbons having 1 to 12 carbon atoms (optionally partly or fully halogenated), alcohols, ethers, carboxylic acids, esters, nitriles, amines, amides, sulphoxides and water. Particular preference is given to n-pentane, n-hexane, n-heptane, n-octane, n-decane, dodecane, cyclohexane, cyclooctane, cyclodecane, dicyclopentane, benzene, toluene, m-xylene, p-xylene, mesitylene, indane, indene, tetrahydronaphthalene, decahydronaphthalene, diethyl ether, dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, p-dioxane, acetonitrile, dimethylformamide, dimethyl sulphoxide, dichloromethane and chloroform.

The formulations used in accordance with the invention may additionally contain, as well as the at least one dopant, the at least one hydridosilane and the at least one hydridosilane oligomer and any solvent(s) present, also further substances, especially nanoparticles or additives for adjustment of the rheological properties. Corresponding substances are known to those skilled in the art. However, it is preferable that the compositions used do not consist of nanoparticles.

For the method according to the invention, the semiconductor substrates used are especially silicon wafers. These may, for example, be polycrystalline or monocrystalline and may already have base doping. This base doping may be doping with a n- or p-type dopant, as already defined above.

The compositions are preferably applied via a liquid phase method selected from printing methods (especially flexographic/gravure printing, nano- or microimprinting, inkjet printing, offset printing, reverse offset printing, digital offset printing and screenprinting) and spraying methods (pneumatic spraying, ultrasound spraying, electrospray methods). In general, suitable application methods are all known methods which enable structured coating with two different compositions without substantial overlap.

The compositions can in principle be applied over the full area (i.e. in an unstructured manner) or in a structured manner. Full-area application can especially be effected in the cases in which the first and second compositions are applied to different sides of the wafer. Particularly fine structures can be achieved by the method according to the invention if the compositions have already been applied to the substrate in a structured manner. Corresponding structured application can be achieved, for example, by the use of printing processes. Another possibility is structuring via surface pretreatment of the substrate, especially via modification of the surface tension between the substrate and the precursor-containing coating composition by a local plasma or corona treatment, and hence a local removal of chemical bonds at the substrate surface or a local activation of the surface (e.g. Si—H termination), by chemical etchings or application of chemical compounds (especially by means of self-assembled monolayers). This achieves structuring more particularly by adhesion of the precursor-containing coating composition only to the predefined regions having favourable surface tension and/or adhesion of the dried or converted layer only to predefined regions having favourable surface tension.

Preferably, the method according to the invention, however, can be conducted by printing methods.

More preferably, the method according to the invention is conducted in such a way that the first and second composition are applied in a structured manner simultaneously or successively without overlap to different regions of the wafer, the resulting coatings are partly or fully activated and, optionally, unactivated coating regions on the wafer are oxidized. In this way, it is possible to produce particularly fine structures having different properties. A corresponding method can be used to produce particularly good and easily structured layers.

After the application of the formulations (compositions), a precrosslinking operation can preferably be conducted via a UV irradiation of the liquid film on the substrate, after which the still-liquid film has crosslinked precursor fractions.

After application and any precrosslinking of the formulation, the coated substrate may also preferably be dried prior to conversion, in order to remove any solvent present. Corresponding measures and conditions for this purpose are known to those skilled in the art. In order to remove exclusively volatile formulation constituents, in the case of a thermal drying operation, the heating temperature should be less than 200° C. After the application to the substrate and any subsequent precrosslinking and/or drying operation, the coating composition present on the substrate is fully or partly activated.

Partial activation can be effected, for example, by using a mask or by using contact posts.

The activation in the method according to the invention can in principle be effected in various ways. Preferably, the activation or conversion is conducted thermally and/or using electromagnetic radiation and/or by electron or ion bombardment. Thermal activation is conducted preferably at temperatures of 200-1000° C., preferably 250-750° C., especially preferably 300-700° C. Thermal activation times are preferably between 0.01 ms and 360 min. The activation time is further preferably between 0.1 ms and 10 min, more preferably between 1 s and 120 s.

Corresponding rapid high-energy processes can be effected, for example, by the use of an IR radiator, a hotplate, a heating probe, an oven, a flash lamp, a plasma (especially a hydrogen plasma) or a corona with suitable gas composition, an RTP system, a microwave system or an electron beam treatment (if required, in the respective preheated or warmed state).

Alternatively or additionally, activation can be effected by irradiation with electromagnetic radiation, especially with UV light. The activation time may preferably be between 1 s and 360 min. The structuring or (partial) activation in this case can be achieved, for example, through use of point or linear radiation sources or through the use of masks. More preferably, the activation is conducted by irradiation with laser radiation. The use of point or linear radiation sources, especially of lasers, is advantageous since it is possible to achieve particularly fine structures thereby. In addition, in the case of use of monochromatic radiation, it is possible via control of the wavelength needed for the activation to reduce parasitic absorption and hence the unwanted heating of substrate and/or environment. The use of electromagnetic radiation for the activation is thus preferred for that reason.

Activation is likewise possible with ion bombardment. The ions can be generated in various ways. Frequently, impact ionization, especially electron impact ionization (EI) or chemical ionization (CI), photoionization (PI), field ionization (FI), fast atom bombardment (FAB), matrix-assisted laser desorptionionzation (MALDI) and electrospray ionization (ESI) are used. In the case of ion bombardment, structuring can likewise be achieved through masks.

The partial activation thus leads to regions on the substrate in which the coating composition present thereon has been converted, and to regions in which the coating composition present thereon has not been converted.

An activation may be understood in the present context to mean a conversion of the deposited precursors of the coating film formed in amorphous or crystalline semiconductor layers. Preferably, the activation in the case of use of exclusively silicon-containing precursors is conducted so as to result in, after the conversion, structured amorphous or crystalline, especially poly- or monocrystalline, silicon layers. Ways and means of doing this are known to those skilled in the art. In one embodiment, the activation is conducted in such a way as to form amorphous silicon (a-Si).

If the conversion was not preceded by drying, the unconverted regions can also be dried after the conversion. Here too, the drying is effected at temperatures below 200° C., preferably in the range from 100 to 200° C. The drying can also be used to establish defined states in the regions having unconverted coating, and these can be used to partly control the optical and electrical properties of the coating after the optional oxidation step that then follows.

After the partial conversion, unconverted coating on the substrate can be oxidized. In the case of use of silicon precursor compounds, silicon oxide-containing layer structures thus form in the regions having unconverted coating. The converted silicon-containing regions already obtained by the prior conversion are not oxidized in the process, and so it is possible by the method according to the invention to obtain silicon-containing layer structures directly adjoining silicon oxide-containing layer structures. Because of the use of differently doped starting compositions, n-doped silicon-containing, n-doped silicon oxide-containing, p-doped silicon-containing and p-doped silicon oxide-containing layer structures are thus obtained. The silicon-containing and silicon oxide-containing layer structures differ in terms of their diffusion rates, and so the dopant atoms from the silicon-containing layers diffuse into the substrate beneath in the diffusion step at a higher diffusion rate than the dopant atoms from the silicon oxide-containing layers. Therefore, highly doped regions are produced beneath the activated regions, while regions with low doping are produced beneath the unactivated, oxidized regions.

The person skilled in the art knows how the oxidation conditions have to be chosen in order that unconverted coating regions are oxidized without likewise oxidizing already converted regions.

Preferably, the oxidation is effected in an oxygen-containing atmosphere at a temperature of ≤ 300° C., further preferably at a temperature of ≤150° C., more preferably at a temperature of ≤ 100° C. Most preferably, the oxidation is effected in an oxygen-containing atmosphere at room temperature. The oxygen-containing atmosphere preferably has an oxygen concentration of 1-100 mol % and may, for example, contain nitrogen or argon as further gaseous constituents.

Particular preference is additionally given to oxidation with oxidizing agents selected from the group consisting of ozone, carbon dioxide, hydrogen peroxide ($H_2O_2$), water vapour ($H_2O$), a mono- or polyhydric alcohol, a ketone, a carboxylic acid (especially trichloroacetic acid), a carbonic ester and mixtures comprising trichloroacetic acid and oxygen, and HCl and oxygen. Ways and means of oxidation with these oxidizing agents are known to those skilled in the art. Particular preference is given to the use of ozone, carbon dioxide, hydrogen peroxide ($H_2O_2$), water vapour ($H_2O$), a carboxylic acid (especially trichloroacetic acid), a carbonic ester and a mixture comprising trichloroacetic acid and oxygen.

The method described for doping of silicon wafers can additionally be conducted repeatedly, based on one wafer, either simultaneously or twice or more in succession, in which case, however, corresponding regions of the wafer surface are coated either repeatedly with the first composition or repeatedly with the second composition, but not with both compositions. The activation of different coatings can be effected simultaneously or successively. This means that the invention covers both methods in which the first and second composition are applied simultaneously or successively, followed by the complete or partial activation and then optionally oxidation of the regions coated both with the first and with the second composition, and methods in which the first composition is first applied, fully or partly activated and optionally oxidized, and then the second composition is applied, fully or partly activated and optionally oxidized.

The diffusion step, i.e. the step of heating the semiconductor substrate in order to allow the dopant atoms to diffuse out of the coating into the semiconductor substrate beneath, in various embodiments, is effected at temperatures of more than 700° C., especially 700-1200° C. Such a step is conducted, for example, for 10 minutes to 10 h, especially at least about 30 minutes.

In other embodiments, the activation is conducted in such a way as to form crystalline silicon. It is especially preferable here to conduct the activation in such a way that the silicon crystallizes epitaxially. In other words, the doped precursor deposited fits into the crystal structure of the silicon wafer. Especially in the case of use of monocrystalline Si wafers (FZ or Cz), the epitaxially crystallized region thus has very high electronic quality and need not be removed subsequently. This is advantageous since the additional process step of removal is dispensed with as a result. The epitaxial growth is effected preferably at temperatures of 600-1200° C., which prevail for a period of 30 s-3 hours. More particularly, epitaxial growth can also be generated by a rapid thermal annealing step of 20-40 s at temperatures of 800-1200° C. An advantageous factor for epitaxial growth is the high purity of the polysilanes used and the low thickness of the deposited layers of preferably 5-150 nm.

The diffusion step can be effected under a protective gas atmosphere, especially an argon or nitrogen atmosphere, or alternatively also in an oxygen-rich environment. In various embodiments, the diffusion step is conducted in the presence of oxygen. As a result, the elemental silicon is oxidized in situ on the substrate surface, on which an oxide grows. This can then subsequently go on to be used as a passivation layer. This oxidation need not be restricted to particular regions of the surface, but can generally be effected in all regions in which elemental silicon comes into contact with the oxygen-containing atmosphere. The oxide produced in such a way typically has a layer thickness of about 10 nm. Alternatively, such an oxidation step can also be effected separately after the diffusion step.

The step is typically conducted in a diffusion oven. This oven may, for example, be a conveyor belt oven or a quartz tubular oven.

The methods described herein may also include a step in which the oxidized regions of the coating of the surface of the silicon wafer are removed. This can be effected, for example, by means of a wet-chemical etching method. An example of a suitable method for removing silicon oxide is a wet-chemical etching method using hydrofluoric acid, for example 2%-10% HF in water. Such an etching step may follow the outward diffusion step and is effected, for example, over a period of 1 to 20 minutes. Such a step can remove both the oxides which have formed in the oxidation of the unactivated regions of the coating and any oxides produced during the diffusion step.

In various embodiments of the invention, the method according to the invention is directed to the different doping of a silicon wafer for the production of back-contact solar cells, comprising the steps of
1. printing a liquid Si-based composition containing a p-type dopant in the form of a wet film in finger structure or in the form of dots onto one side of the silicon wafer;
2. printing a liquid Si-based composition containing an n-type dopant in the form of a wet film in a form complementary to the form deposited in 1. onto the same side of the silicon wafer,
3. converting the wet films to elemental silicon, especially amorphous or crystalline, epitaxial silicon, or silicon oxide, by complete or partial conversion or oxidation;
4. outward diffusion;
5. optionally: removing the SiO, for example by means of hydrofluoric acid.

In all the embodiments of the invention described here in which the two compositions are applied to the same side of the wafer, the method may additionally include the step of applying a further composition to the opposite side of the semiconductor substrate, especially of the wafer. This composition may likewise be in liquid form and may be applied by printing, for example in the form of a wet film. This composition may contain either n- or p-type, especially n-type, dopants. In various embodiments, the composition is a precursor composition and is as defined for the above-described first or second composition. The application, activation, oxidation, etc. can likewise be effected as described above for the first and second composition. More particularly, the corresponding activation and optional oxidation steps can be effected together with the activation/oxidation of the regions coated with the first and/or second composition, or separately.

In various other embodiments of the invention, the method according to the invention is directed to the different doping of a silicon wafer for the production of bifacial solar cells, comprising the steps of 1. printing a liquid Si-based composition containing a p-type dopant in the form of a wet film onto one side of the silicon wafer;
2. converting the wet film to elemental silicon, especially amorphous or crystalline, epitaxial silicon, or silicon oxide, by complete or partial conversion or oxidation;
3. printing a liquid Si-based composition containing an n-type dopant in the form of a wet film onto the other side of the silicon wafer,
4. converting the wet film to elemental silicon, especially amorphous or crystalline, epitaxial silicon, or silicon oxide, by complete or partial conversion or oxidation;
5. outward diffusion;
6. optionally: removing the SiO, for example by means of hydrofluoric acid.

The present invention also further provides the semiconductor substrates produced by the method according to the invention and for the use thereof, especially for the production of electronic or optoelectronic components, preferably solar cells. The solar cells may, for example, be back-contact solar cells.

In the production of solar cells, the semiconductor substrate produced in accordance with the invention, in a further step, can be coated with a silicon nitride layer (over a large area, especially over the whole area), and then a metal-containing composition for the production of metallic contacts, for example a silver paste, is applied to particular regions of the silicon nitride layer and burnt through by heating, in order to establish contact with the doped layer beneath. The metal-containing composition is applied especially in the regions having high doping.

Finally, the present invention also covers solar cells and solar modules comprising the semiconductor substrates produced in accordance with the invention.

The examples which follow elucidate the subject-matter of the present invention without themselves having any limiting effect.

EXAMPLES

1. By means of spin-coating, phosphorus-doped formulations consisting of 30% neopentasilane with 1.5% phosphorus doping and 70% toluene and cyclooctane solvents were applied to both sides of an n-type silicon wafer having a resistivity of 5 ohmcm. Conversion at 500° C. for 60 s to a 50 nm-thick amorphous silicon layer. Outward diffusion of the phosphorus atoms into the SI wafer at 1000° C. for 30 min. A phosphorus-doped region forms in the silicon wafer with a sheet resistance of 60 ohms/sq. The emitter saturation current of the highly doped region was determined to be 800 fA/cm$^2$. In addition, it was found that the amorphous silicon crystallizes epitaxially on the silicon wafer during the outward diffusion. In addition, it was found that the amorphous silicon fits into the crystal structure of the silicon wafer and crystallizes epitaxially on the silicon wafer during the outward diffusion, as can be inferred from the diffraction image appended as Annex 1.

2. By means of spin-coating, boron-doped formulations consisting of 30% neopentasilane with 1.5% boron doping and 70% toluene and cyclooctane solvents were applied to both sides of an n-type silicon wafer having a resistivity of 5 ohmcm. Conversion at 500° C. for 60 s to a 50 nm-thick amorphous silicon layer. Outward diffusion of the boron atoms into the Si wafer at 1050° C. for 60 min. A boron-doped region forms in the silicon wafer with a sheet resistance of 50 ohms/sq. The emitter saturation current of the highly doped region was determined to be 1000 fA/cm$^2$. In addition, it was found that the amorphous silicon crystallizes epitaxially on the silicon wafer during the outward diffusion.

3. Production of a bifacial solar cell: By means of spin-coating, boron-doped formulations consisting of 30% neopentasilane with 1.5% boron doping and 70% toluene and cyclooctane solvents were applied to the front side of an n-type silicon wafer having a resistivity of 5 ohmcm. Conversion at 500° C. for 60 s to a 50 nm-thick amorphous silicon layer. Then, by means of spin-coating, deposition of a phosphorus-doped formulation consisting of 30% neopentasilane with 1.5% phosphorus doping and 70% toluene and cyclohexane solvents onto the reverse side of the n-type wafer. Conversion at 500° C. for 60 s to a 50 nm-thick amorphous silicon layer. Outward diffusion of the boron and phosphorus atoms into the Si wafer at 1050° C. for 30 min. Then deposition of aluminium in a finger structure onto the front side and over the whole of the reverse side. The solar cell produced in this way had an efficiency of 10.2%.

4. Production of a back-contact solar cell:
   a. printing a liquid Si-based composition containing a p-type dopant in the form of a wet film in finger structure or in the form of dots onto one side of the silicon wafer. Ink normally contains 30% neopentasilane with 1%-10% boron doping and 70% toluene and cyclooctane solvents. The fingers typically have widths of 200 µm-1000 µm, the dots a diameter of 10 µm-400 µm.
   b. printing a liquid Si-based composition containing an n-type dopant in the form of a wet film in a form complementary to the structure deposited in 1. onto the same side of the silicon wafer. Here too, ink normally contains 30% neopentasilane with 1%-10% phosphorus doping and 70% toluene and cyclooctane solvents. The fingers typically have widths of 200 µm-1000 µm;
   c. converting the wet films to elemental silicon, especially amorphous silicon, or silicon oxide, by partial conversion or oxidation. The conversion takes place at temperatures of 400-600° C. Duration: 1 s-2 minutes. Preferably 60 s at 500° C. Oxidation in an oxygen-containing atmosphere at a temperature between room temperature and 300° C. Duration: dependent on temperature, 30 s-30 min. The layer thickness of the amorphous silicon is 10-100 nm.
   d. printing a liquid Si-based composition containing a p-type or n-type dopant in the form of a wet film onto the opposite side of the wafer;

e. converting the wet films to elemental silicon, especially amorphous silicon, or silicon oxide, by partial conversion or oxidation;
f. outward diffusion at 700-1300° C. for a period of 5-120 minutes under a nitrogen atmosphere. Optional addition of oxygen in the form of $O_2$ or $H_2O$. As a result of the addition of the oxygen, the Si surface is oxidized and an SiO film grows on the Si wafer. Typical layer thickness of the SiO is 10 nm;
g. optionally: removing the SiO, for example by means of hydrofluoric acid, for 1-15 min in 1-40% HF at room temperature.

The invention claimed is:

1. A liquid-phase method for doping a semiconductor substrate, the method comprising:
applying a first composition comprising at least one first dopant to one or more regions of a surface of the semiconductor substrate, thereby obtaining one or more regions of the surface of the semiconductor substrate comprising a coating of the first composition;
applying a second composition comprising at least one second dopant to one or more regions of a surface of the semiconductor substrate, thereby obtaining one or more regions of the surface of the semiconductor substrate comprising a coating of the second composition,
wherein the one or more regions comprising a coating of the first composition and the one or more regions comprising a coating of the second composition are different and do not overlap significantly, and
wherein the first dopant is an n-type dopant and the second dopant is a p-type dopant or the first dopant is a p-type dopant and the second dopant is an n-type dopant;
fully or partially activating the one or more regions of the surface of the semiconductor substrate comprising a coating of the first composition, the one or more regions of the surface of the semiconductor substrate comprising a coating of the second composition, or both;
optionally oxidizing one or more regions of the surface of the semiconductor substrate comprising a coating of the first composition that are not activated, one or more regions of the surface of the semiconductor substrate comprising a coating of the second composition that are not activated, or both;
optionally applying a third composition which does not comprise a dopant to the one or more regions of the surface of the semiconductor comprising a coating of the first composition that are at least one selected from the group consisting of fully activated, partially activated, and not activated, the one or more regions of the surface of the semiconductor comprising a coating of the second composition that are at least one selected from the group consisting of fully activated, partially activated, and not activated, or both; and
heating the semiconductor substrate to a temperature at which the first dopant diffuses out of the coating comprising the first composition into the semiconductor substrate and the second dopant diffuses out of the coating comprising the second composition into the semiconductor substrate.

2. The method according to claim 1, wherein the fully or partially activating the one or more regions comprising a coating of the first composition, the optionally oxidizing one or more regions of the surface of the semiconductor substrate comprising a coating of the first composition that are not activated, or both is performed prior to the applying of the second composition, the fully or partially activating the one or more regions of the surface of the semiconductor substrate comprising a coating of the second composition and the optionally oxidizing one or more regions of the surface of the semiconductor substrate comprising a coating of the second composition that are not activated.

3. The method according to claim 1, wherein the applying of the third composition is performed, and wherein the applying of the third composition is performed prior to the heating.

4. The method according to claim 1, wherein at least one selected from the group consisting of the applying of the first composition, the applying of the second composition, and the optionally applying of the third composition is performed by a printing of spraying method.

5. The method according to claim 1, wherein
the n-type dopant is at least one selected from the group consisting of phosphorous-containing dopants, arsenic-containing dopants, and antimony-containing dopants; and
the p-type dopant is a boron-containing dopant.

6. The method according to claim 1, wherein at least one selected from the group consisting of the first composition, the second composition, and the optional third composition is a precursor composition, the precursor composition comprising
(a) at least one precursor comprising silicon which is liquid under standard ambient temperature and pressure SATP conditions; or
(b) at least one solvent and at least one precursor comprising silicon, germanium, or both which is liquid or solid under standard ambient temperature and pressure SATP conditions.

7. The method according to claim 6, wherein the precursor is at least one selected from the group consisting of
polysilanes of the general formula $Si_nX_c$ wherein X=H, F, Cl, Br, I, $C_1$-$C_{10}$-alkyl, $C_1$-$C_{10}$-alkenyl, $C_5$-$C_{20}$-aryl, $n \geq 4$ and $2n \leq c \leq 2n+2$,
polysiloxanes of the general formula $Si_nH_cO_dR_e$ wherein R=$C_1$-$C_{10}$-alkyl, $C_1$-$C_{10}$-alkenyl, $C_5$-$C_{20}$-aryl, $n \geq 2$ and $(n-1) \leq d \leq n$, $0 \leq c \leq 3n$ and $0 \leq e \leq 3n$, and
polysilazanes of the general formula $Si_nH_mN_bR_c$ wherein R=$C_1$-$C_{10}$-alkyl, $C_1$-$C_{10}$-alkenyl; $C_5$-$C_{20}$-aryl, $C_1$-$C_{10}$-alkoxy, $n \geq 2$, $0 \leq m \leq 3n$, $(n-1) \leq b \leq n$ and $0 \leq c \leq 3n$.

8. The method according to claim 6, wherein the precursor is a nanoparticle comprising silicon.

9. The method according to claim 6, wherein the precursor composition comprises at least two precursors of which at least one precursor is a hydridosilane oligomer and at least one precursor is an optionally branched hydridosilane of the generic formula $Si_nH_{2n+2}$ with n=3 to 10.

10. The method according to claim 9, wherein the hydridosilane oligomer
(a) has a weight-average molecular weight of 200 to 10000 g/mol; and/or
(b) is obtained by an oligomerization of a noncyclic hydridosilane; and/or
(c) is obtained by a thermal conversion of a composition comprising at least one noncyclic hydridosilane having not more than 20 silicon atoms in the absence of a catalyst at a temperature of less than 235° C.

11. The method according to claim 1, wherein the optionally oxidizing is performed and converts the one or more regions surface of the semiconductor comprising a coating of the first composition that are not activated, one or more regions of the surface of the semiconductor substrate comprising a coating of the second composition that are not activated, or both to a doped silicon oxide.

12. The method according to claim 1, wherein the fully or partially activating is performed thermally in the presence of at least one selected from the group consisting of electromagnetic radiation, electron or ion bombardment, conducted heat, and radiated heat.

13. The method according to claim 1, wherein
(a) the optionally oxidizing is performed and wherein the oxidizing is perform in an oxygen-containing atmosphere at a temperature of ≤300° C.; and/or
(b) the optionally oxidizing is performed and wherein the oxidizing is performed in the presence of at least one oxidizing agent selected from the group consisting of ozone, carbon dioxide, hydrogen peroxide ($H_2O_2$), water vapour ($H_2O$), a mono- or polyhydric alcohol, a ketone, a carboxylic acid, a carbonic ester, a mixture comprising trichloroacetic acid and oxygen, and a mixture comprising HCl and oxygen.

14. The method according to claim 1, wherein the heating is conducted at a temperature of more than 700° C. for a time of 10 minutes to 1 h.

15. The method according to claim 1, wherein the fully or partially activating the one or more regions of the surface of the semiconductor substrate comprising a coating of the first composition, the one or more regions of the surface of the semiconductor substrate comprising a coating of the second composition, or both converts the coating comprising the first substrate, the coating comprising the second substrate or both to a crystalline silicon.

16. The method according to claim 1, further comprising oxidizing elemental silicon at a surface of the semiconductor substrate to silicon oxide,
wherein the oxidizing of elemental silicon is performed during or after the heating to a temperature at which the first dopant diffuses and the second dopant diffuses.

17. The method according to claim 1, wherein the semiconductor substrate is a silicon wafer.

18. The method according to claim 1, wherein the first composition and the second composition are applied to a same side of the semiconductor substrate.

19. The method according to claim 18, further comprising applying a further composition comprising at least one n-type or p-type dopant to a side opposite to the same side of the semiconductor substrate thereby obtaining one or more regions of the opposite side surface of the semiconductor substrate comprising a coating of the further composition,
fully or partially activating the one or more regions of the opposite side surface of the semiconductor comprising a coating of the further composition, and
optionally oxidizing one or more regions of the opposite side surface of the semiconductor comprising a coating of the further composition that are not activated.

20. The method according to claim 1, wherein the first composition and the second composition are applied to opposite sides of the semiconductor substrate.

21. The method according to claim 1, wherein the optionally oxidizing is performed, the method further comprising
removing an oxidized region of the coating and the surface of the semiconductor substrate
wherein the removing is performed after the heating to a temperature at which the first dopant diffuses and the second dopant diffuses.

22. A semiconductor substrate obtained by the method according to claim 1.

23. A method for the production of solar cells, the method comprising:
providing the semiconductor substrate according to claim 22.

24. A solar cell or solar module comprising the semiconductor substrate according to claim 22.

25. A liquid-phase method for doping a semiconductor substrate, the method comprising:
applying a first composition comprising at least one first dopant and a first precursor comprising silicon, germanium or bath to one or more regions of a surface of the semiconductor substrate, thereby obtaining one or more regions of the surface of the semiconductor substrate comprising a coating of the first composition;
applying a second composition comprising at least one second dopant and a second precursor comprising silicon, germanium or both to one or more regions of a surface of the semiconductor substrate, thereby obtaining one or more regions of the surface of the semiconductor substrate comprising a coating of the second composition;
wherein the one or more regions comprising a coating of the first composition and the one or more regions comprising a coating of the second composition are different and do not overlap significantly, and
wherein the first dopant is an n-type dopant and the second dopant is a p-type dopant or the first dopant is a p-type dopant and the second dopant is an n-type dopant;
fully or partially activating the one or more regions of the surface of the semiconductor substrate comprising a coating of the first composition, the one or more regions of the surface of the semiconductor substrate comprising a coating of the second composition, or both;
heating the semiconductor substrate to a temperature at which the first dopant diffuses out of the coating comprising the first composition into the semiconductor substrate and the second dopant diffuses out of the coating comprising the second composition into the semiconductor substrate.

26. The method according to claim 25, wherein the first precursor and the second precursor are at least one selected from the group consisting a polysilane, a polysiloxane, a polysilazane, a hydridosilane, a branched hydridosilane, and a hydridosilane oligomer having a weight-average molecular weight of 200 to 10000 g/mol.

* * * * *